(12) United States Patent
Cheung et al.

(10) Patent No.: US 6,618,312 B2
(45) Date of Patent: Sep. 9, 2003

(54) METHOD AND DEVICE FOR PROVIDING A MULTIPLE PHASE POWER ON RESET

(75) Inventors: Hugo Cheung, Tucson, AZ (US); Lu Yuan, Carlsbad, CA (US); Terence Chiu, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/014,771

(22) Filed: Dec. 11, 2001

(65) Prior Publication Data

US 2002/0163368 A1 Nov. 7, 2002

Related U.S. Application Data

(60) Provisional application No. 60/289,006, filed on May 4, 2001.

(51) Int. Cl.[7] ................................................ G11C 7/00
(52) U.S. Cl. ...................... 365/226; 365/228; 713/300; 713/340
(58) Field of Search ................. 365/226, 277, 365/228; 713/300, 340, 1, 2

(56) References Cited

U.S. PATENT DOCUMENTS

| 5,564,010 A | * | 10/1996 | Henry et al. .................. 714/22 |
| 5,606,511 A | * | 2/1997 | Yach ............................ 702/64 |
| 6,366,521 B1 | * | 4/2002 | Roohparvar ................. 365/226 |
| 2002/0036941 A1 | * | 3/2002 | Roohparvar ................. 365/226 |

FOREIGN PATENT DOCUMENTS

| JP | 405149980 A | * | 6/1993 | ......... G01R/19/165 |

* cited by examiner

Primary Examiner—Viet Q. Nguyen
(74) Attorney, Agent, or Firm—W. Daniel Swayze, Jr.; W. James Brady; Frederick J. Telecky, Jr.

(57) ABSTRACT

A method and apparatus is provided for performing an intelligent power-on-reset, and enabling the verification of a current voltage level with a reconfigurable brown out reset voltage level. In addition, the verification process may be selectively bypassed. Furthermore, the flash memory provides storage for the reconfigurable brown out reset voltage level and selected verification process enable/disable signal. In addition, the verification process occurs in a second phase during which some devices are released from reset mode and then those devices control the verification process.

22 Claims, 3 Drawing Sheets

METHOD AND DEVICE FOR PROVIDING A MULTIPLE PHASE POWER ON RESET

CROSS-REFERENCE TO RELATED APPLICATION

This application claims the benefit of, and priority to, U.S. Provisional Application Serial No. 60/289,006 filed May 4, 2001, which is hereby incorporated by reference in its entirety.

FIELD OF INVENTION

The present invention relates to a power-on-reset system for use in microcontroller-based products. More particularly, the present invention relates to a multiple phase power-on-reset device and technique for facilitating the reliable powering on and resetting of the microcontroller.

BACKGROUND OF THE INVENTION

The demand for higher performance, microcontroller-based products for use in communication and processing applications continues to increase rapidly. As a result, microcontroller-based product manufacturers are requiring for the components and devices within these products to be continually improved to meet the design requirements of a myriad of emerging audio, video and imaging applications. These microcontroller-based products use various types of processors, for example, general purpose microprocessors for controlling the logic of various digital devices, such as clock radios, microwave ovens, digital video recorders and the like, and special purpose microprocessors, such as math coprocessors for mathematical computations, or digital signal processors used in manipulating various types of information, including sound, imaging and video information.

The microcontroller typically includes a central processing unit (CPU) core for the processing functions, and a bus interface for communication with the various memory devices as well as external or other peripheral devices. For the storage of data, the microprocessor can include various types of memory. For example, the CPU for the microcontroller may include Random Access Memory (RAM) as well as Read-Only Memory (ROM). In addition, the microcontroller can also include flash memory which can be erased in blocks and reprogrammed one byte at a time.

For the transmitting and receiving of data between various devices and components, microprocessors and other devices utilize various types of serial interfaces. One such type of interface typically used is the serial peripheral interface (SPI). In addition, for the temporary storage of data, for example, to permit the microprocessors to manipulate the data before transferring the data through the SPI to another device, the microprocessors generally utilize one or more buffers. These buffers are configured with the SPI's to enable the processors to transmit and receive data to and from the buffers as needed in an application.

When a microprocessor or other electronic device is powered on, the power supply generally ramps up to a steady supply voltage level. Some power supplies ramp up faster than others, and generally, the more quickly a power supply ramps up the more expensive the power supply is to purchase. Until such power supplies reach a desired voltage level, individual circuits and devices as a whole behave unpredictably. For example, some devices may begin to work properly at a lower voltage than other devices. Some devices may also begin to work properly at less than their rated voltage levels. With only some of the components working properly, the whole system may behave unpredictably. In addition, devices operating at less than the rated voltages are less reliable. Therefore, circuits are typically held in a reset mode until a minimum voltage level has been reached.

Furthermore, if during normal operation, the power level drops below this minimum voltage level, for example when a laptop's battery begins to run out of power, the circuits are also placed in reset mode. This minimum voltage level is known as the brown out reset voltage level. The brown out reset voltage level varies among different digital devices and even varies among different applications for the same integrated circuit ("IC") device. Furthermore, the time to ramp up to the brown out reset voltage for a particular IC device may change if the power supply is replaced over the life of the IC device. Thus, it is desirable to be able to set the brown out reset voltage level and to be able to reconfigure the voltage level for various applications from time to time.

If the reset mode is released for even a short period of time, before the brown out reset voltage level is reached, the entire device may fail, crash, or be laden with potential errors that could cause the device to perform unpredictably at some later point in time. Therefore, it is desirable to have accurate and reliable power-on-reset devices. Furthermore, it is also desirable to turn on the device as quickly as reliably possible.

Previous attempts to provide a predictable power on for an IC device have included the use of fuses to set the brown out reset voltage level. However, this approach has various drawbacks as fuses are relatively unreliable. For example, it is difficult to test whether the desired fuses are blown, partially blown or not blown at all. Furthermore, systems that are programmed by blowing selected fuses are not reconfigurable once the system is programmed. In addition, in systems that are programmed via fuses, a discrete number of fuses are used. Thus, the voltage levels available to be set as the brown out voltage level are limited to discrete voltage levels with an error potential of half the voltage difference between successive possible voltage levels. Although some approaches have included additional fuses to reduce this source of error, these approaches generally require further IC space and material, increased product size, and the increased probability of device failure by adding additional fuses that may fail.

In addition, prior attempts to provide power-on-reset control have been rudimentary. Prior attempts, for example, do not lend themselves to providing intelligent functions upon the occurrence of particular conditions. Moreover, prior attempts may not be easily reprogrammed to account for system changes.

Accordingly, a need exists for an improved system for powering on an IC device that solves the above problems. In addition, a need exists for an improved system for powering on an IC device that provides the ability to set and reconfigure the brown out voltage level, with accuracy, for different configurations. Furthermore, a need exists for a more reliable powering on of an IC device. Also, a need exists for power-on-reset methods that allow the use of less expensive power supply devices while still providing quick power on reset. In addition, a need exists for an improved system for powering on an IC device that is compact and uses less surface area on a chip.

SUMMARY OF THE INVENTION

The method and device according to the present invention addresses many of the shortcomings of the prior art. In accordance with one aspect of the present invention, a method and device is provided which powers on an integrated circuit device by holding all of the integrated circuits of a microcontroller in a reset mode until a subset of circuits can be reliably released, wherein the subset of circuits is then used to determine when to release the rest of the circuits of the integrated circuit device. In accordance with an exemplary embodiment of the present invention, a two phase process is provided where, during a first phase, all circuits are held in reset mode until a sufficiently high voltage level allows for powering on of a system reset device which, during a second phase, continues to hold the remaining circuits in reset mode until the current voltage level reaches a reprogrammable brown out level. In addition, during normal operation, when the voltage drops below this programmed brown out voltage level, the device reenters the second phase and remains there until the voltage goes above this level. In accordance with another aspect, a reprogrammable enable signal is provided allowing reprogrammable bypass of the second phase voltage level checking. In another exemplary embodiment of the present invention, flash memory is used to hold the reprogrammable brown out level and enable.

In accordance with another aspect of the present invention, the reprogrammable brown out voltage level and brown out enable creates a power-on-reset apparatus that can be flexibly adaptable to changing integrated circuits. In other aspects, the reprogrammable brown out level is testable, more accurate and more reliable than fuse type power-on-reset devices. In accordance with a further aspect, the two phase process provides additional power on functionality. In another aspect, the power-on-reset provides a time efficient power-on-reset process which is also space efficient.

BRIEF DESCRIPTION OF THE DRAWINGS

A more complete understanding of the present invention may be derived by referring to the detailed description and claims when considered in connection with the Figures, where like reference numbers refer to similar elements throughout the Figures, and:

DETAILED DESCRIPTION OF EXEMPLARY EMBODIMENTS OF THE INVENTION

Figure 1:
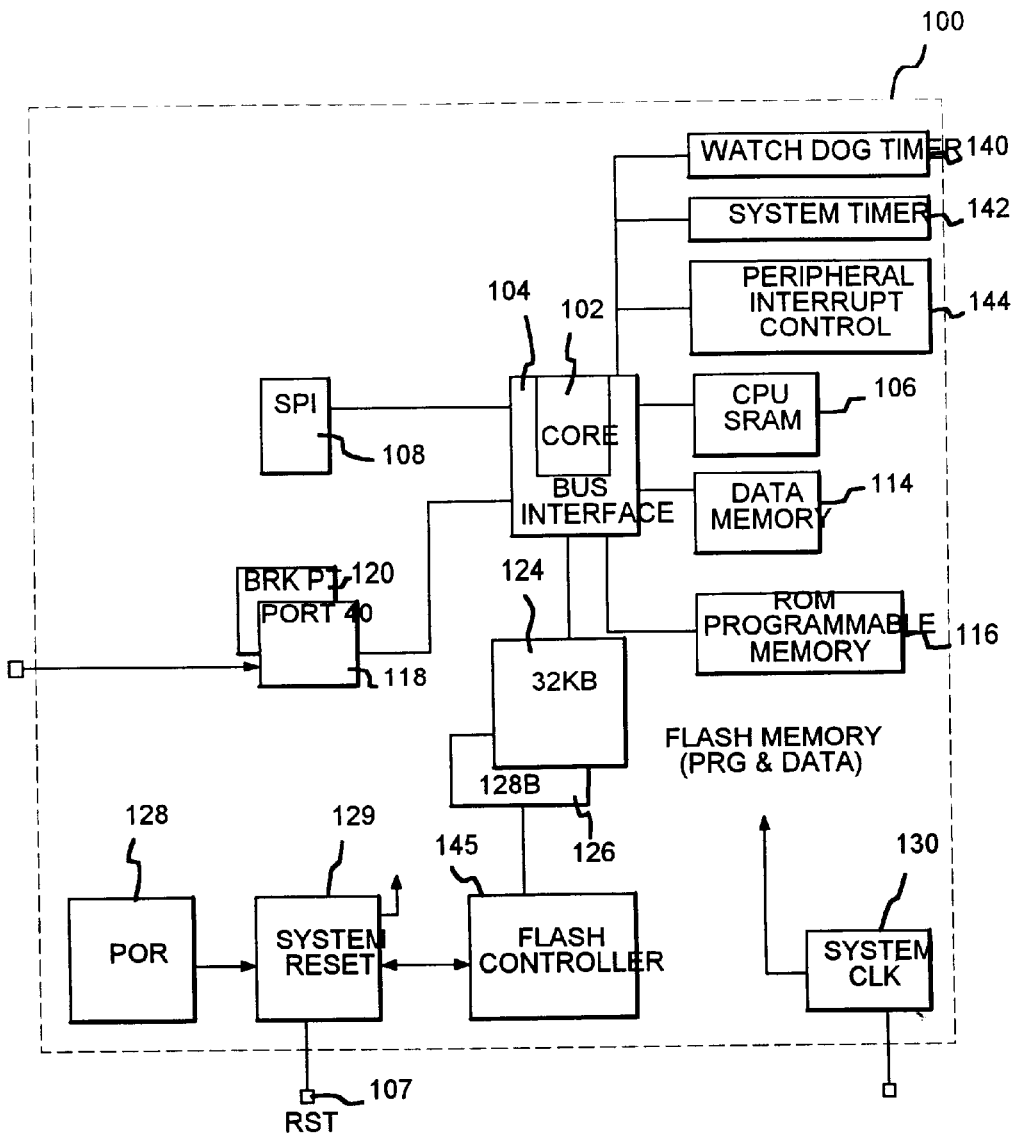
FIG. 1 illustrates a block diagram of an exemplary microcontroller in accordance with an exemplary embodiment of the present invention.

The present invention may be described herein in terms of various functional components and various processing steps. It should be appreciated that such functional components may be realized by any number of hardware or structural components configured to perform the specified functions. For example, the present invention may employ various integrated components, e.g., buffers, voltage and current references, memory components and the like, comprised of various electrical devices, e.g., resistors, transistors, capacitors, diodes or other devices, whose values may be suitably configured for various intended purposes. In addition, the present invention may be practiced in any microcontroller-based application. Such general applications that may be appreciated by those skilled in the art in light of the present disclosure are not described in detail herein. However for purposes of illustration only, exemplary embodiments of the present invention are described herein in connection with a microcontroller.

Further, it should be noted that while various components may be suitably coupled or connected to other components within exemplary circuits, such connections and couplings can be realized by direct connection between components, or by connection through other components and devices located therebetween. To understand the various operational sequences of the present invention, an exemplary description is provided. However, it should be understood that the following example is for illustration purposes only and that the present invention is not limited to the embodiments disclosed.

As discussed above, previous attempts for setting the brown out reset voltage level used during the power-on-reset are not reliable and are not configurable. An unreliable setting for the brown out reset voltage level can result in unpredictable system behavior if the system reset signal is activated before the brown out reset voltage level is reached.

Unpredictable system behavior may result because various circuits may start to function before the voltage level is reached at which the circuits function correctly. In addition, other approaches do not allow for the ability to reconfigure the brown out reset voltage level for different applications. For example, with the programmable brown out voltage level of an exemplary embodiment, the same microcontroller device can be used for applications that require different voltage levels, such as 3.0 and 5.0 volts, and with different grades of power supplies. When an IC device, such as the microcontroller, is powered on, the power supply for the device undergoes a process whereby the power supply ramps up to a desired voltage. During this ramping up process, the behavior of various circuits of the microcontroller is unpredictable. There is a certain voltage level, known as the brown out reset voltage level, at which all circuits function correctly. Until the brown out reset voltage level is reached, it is desirable to hold the system reset signal, and thus keep the circuits in a "reset mode", so that the various circuits do not operate. By holding the system reset signal until the brown out reset voltage level is reached, unpredictable system behavior can be avoided. In addition, during normal operation, if the voltage drops below this brown out voltage level, it is desirable to again hold the system reset signal until the voltage goes above this level.

That being said, in accordance with one aspect of the present invention, a method, methods or combination of steps is provided which powers on an integrated circuit device by holding all circuits in a reset mode until a subset of circuits can be reliably released; wherein the subset of circuits is then used to determine when to release the rest of the circuits in the integrated circuit device. In an exemplary embodiment, the subset of circuits reads reprogrammable data from flash memory to retrieve a brown out voltage level which is used to determine when to release the rest of the circuits. In another exemplary embodiment, reprogrammable data is read from flash memory to determine whether or not to verify the brown out voltage levels before releasing all circuits. In accordance with another aspect of the present invention, the method facilitates the reliable setting of the brown out reset voltage level and allows for reconfiguration of this voltage level.

Figure 2:
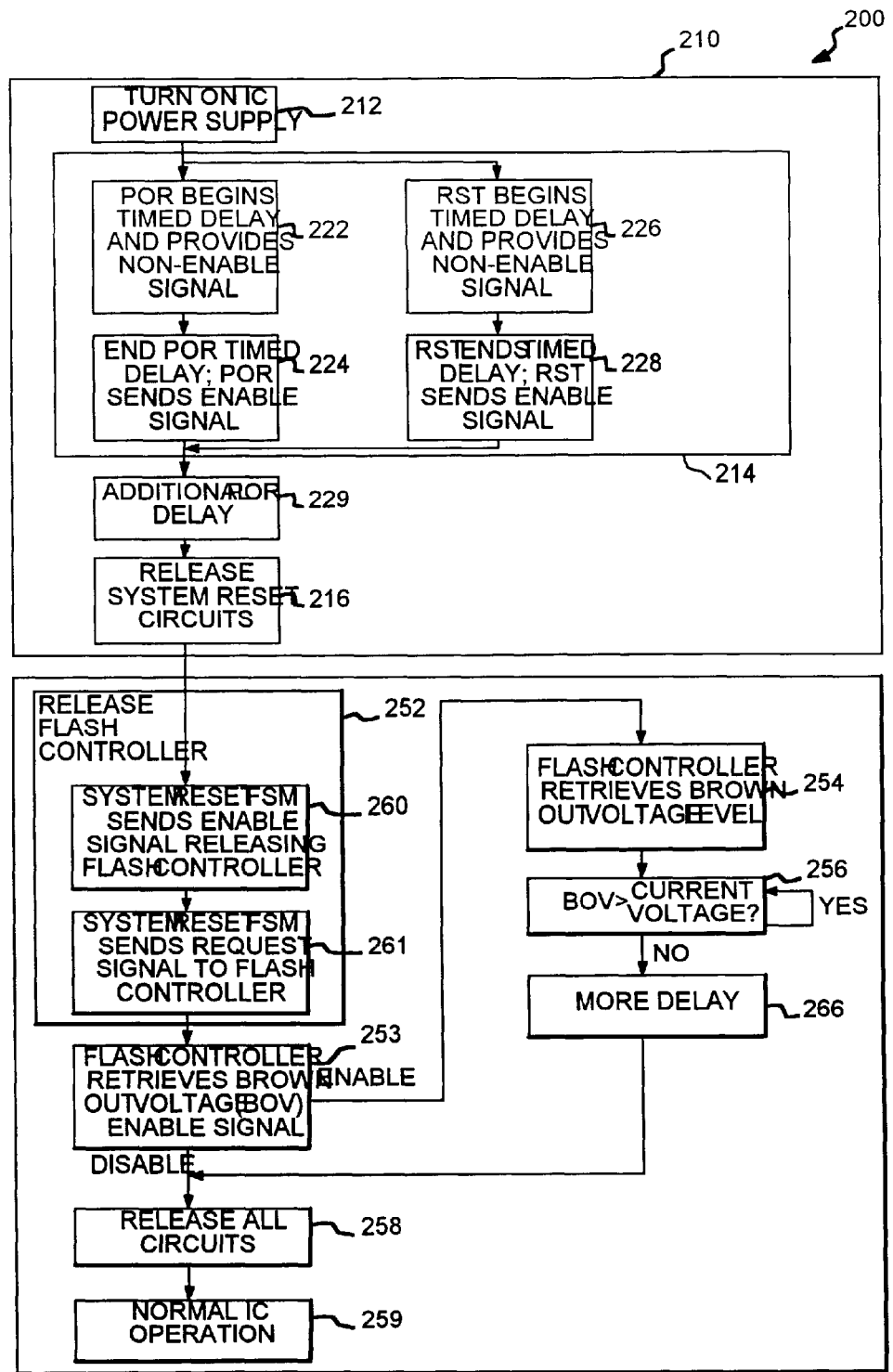
FIG. 2 illustrates a block diagram of an exemplary system reset method in accordance with an exemplary embodiment of the present invention.

To further illustrate, in an exemplary method 200, and with reference to FIG. 2, during a first phase, represented by step 210, the power supply is turned on, the voltage level begins to increase from zero, and all circuits are held until circuits related to a system reset controller can be and are released. During a second phase, represented by step 250, the system reset controller retrieves information from memory and uses this information to determine whether criteria have been satisfied for releasing the rest of the circuits. In other embodiments, this method may be broken up into more phases or sub-steps and may involve other steps which provide the function of holding circuits in a reset mode until a reprogrammable brown out level is reached.

In a further exemplary embodiment of the power-on-reset method, first phase 210 includes the step of turning on the power to the IC power supply in a step 212. In one exemplary embodiment of the present invention, step 212 occurs when the "Power" switch on a computer is pressed. However, in other embodiments, the power-on-reset method may be initiated in a step 212 when a reset signal is received from within the microprocessor or from another external source. Furthermore, in other embodiments, step 212 may comprise initiation by a watch dog timer reset signal, a brown out reset signal, or a firmware reset signal. It should be understood that other reset signals may be used which initiate a power-on-reset method 200.

In another exemplary embodiment, first phase 210 comprises the step 214 of holding all circuits in a "reset mode" for a period of time. Step 214 is accomplished, for example, by holding a reset signal to all devices such that all devices are kept in reset mode until all delay processes have been satisfied. In a step 214, the reset signal, Flsrstn, in one exemplary embodiment, is held low until all delay processes have been satisfied. In a further exemplary embodiment of step 214, two delay processes, POR and RST, may exist. These two delay processes may occur in parallel. For example, a POR device initiates a timed delay during which the POR device provides a POR disable signal, in a step 222. This signal, in one exemplary embodiment is a logic low signal, PORn. Once the timed POR delay is complete, a POR enable signal, for example, PORn logic high signal, is provided in a step 224. Similarly, an RST signal providing device may initiate a timed delay and provide a RST disable signal, for example, RST logic high signal, in a step 226, until the timed delay is completed. Once the timed RST delay is complete, a RST enable signal, for example, RST logic low signal, is provided in a step 228. In these exemplary embodiments, the timed delay's may be caused by more or less circuits and devices external or internal to the IC, and may be of various durations. In an exemplary embodiment of the present invention, holding step 214 may further comprise an additional delay period, optional step 229, for ensuring that voltage levels settle. After enable signals have been received from all controlling delay steps, a portion of the circuits in the integrated circuit device are released in a step 216.

Second phase 250, comprises further exemplary step 252 in which a controller for flash type memory is released. In an exemplary embodiment of the present invention, flash controller release step 252 further comprises receiving, at the flash controller, an enable signal (e.g., step 260). The enable signal of step 260 is, for example, "Flsrstn". Also, a request signal may be received by the flash controller, in a step 261, initiating communications with flash memory.

The flash controller retrieves from flash memory a brown out voltage (BOV) level enable signal, in a step 253. If the BOV level enable signal is enabled, the flash controller retrieves the BOV level from flash memory in a step 254. The BOV level is then compared to the current voltage level in a step 256, and if the current voltage level is less than the BOV level, step 256 is repeated. Once the current voltage level is greater than the BOV level, the power-on-reset method may further comprise a delay period in an optional step 266, and then all circuits are released in a step 258. If the BOV level enable signal is disabled, the method passes directly from step 253 to step 258 where all circuits are released. After all circuits have been released, the integrated circuit device may then perform normal operations in a step 259.

The above description of method 200 is for exemplary purposes only and the steps described can be combined, rearranged, subdivided, and added to while still accomplishing a reconfigurable power-on-reset method. For example, in another exemplary embodiment, the flash controller may retrieve both the BOV enable signal and the BOV level at the same time, combining step 254 into step 253. Furthermore, during normal operation, when the voltage drops below the programmed brown out voltage level, the device reenters second phase 250 at, for example, step 252 or at another appropriate step. In this manner, all circuits again are not released until the voltage goes above the brown out voltage level.

In general, the power-on-reset method in accordance with various aspects of the present invention may include any device or combination of devices or circuits which serve to implement the reconfigurable power-on-reset method discussed above. For example, with reference to FIG. 1, the power-on-reset method may be implemented in an exemplary microcontroller 100. However, the exemplary embodiments of the present invention may be suitably implemented in any microcontroller configuration. In one exemplary embodiment, microcontroller 100 suitably comprises a central processing unit (CPU) core 102 configured for the processing of data, and a bus interface ("Bus IF") 104 for communication with the various memory or input and output devices. For the storage of data, microcontroller 100 can comprise various types of memory. For example, microcontroller 100 can comprise an internal CPU memory 106 which can be implemented using static random access memory (SRAM) and the like which can provide very low access time, e.g., as low as 10 nanoseconds. In addition, microcontroller 100 can include data memory 114 which can comprise, for example, SRAM-type memory. Microcontroller 100 can also include, for example, read-only memory (ROM) 116 which can comprise the non-reprogrammable memory for the microcontroller 100. Still further, microcontroller 100 can also include flash memory for the programming and storage of data, such as a large page of memory 124 comprising, for example, 32 KB of data storage, as well as a smaller configuration of flash memory 126, comprising, for example, 128 Bytes. Microprocessor 100 can also comprise serial peripheral interface (SPI) 108 for transmitting and receiving data between various components. SPI 108 can communicate with the CPU memory 106 via direct memory access (DMA), i.e., SPI 108 can transfer data between memory components and a device without passing the data through the CPU. This data can be transferred through the bus interface 104 without being passed to the CPU.

Microcontroller 100 can also include input/output devices. For example, an I/O port device 118 can be provided, as well as a breakpoint device 120. Further, microcontroller 100 can also include a system clock 130 for providing clock cycles for triggering various functions and sequences during operation. Microcontroller 100 can also include peripheral devices. For example, peripheral devices might include watch dog timer 140, system timer 142, or peripheral interrupt controller 144. Other peripheral devices will be apparent, and the present invention is not limited to any particular type of peripheral device. Microcontroller 100 can also include a power-on-reset (POR) device 128, a system reset 129, and a flash controller 145 for use during ramping up of a power supply and other related operations. Furthermore, a reset input RST 107 is provided in an exemplary embodiment in communication with system reset 129.

Figure 3:
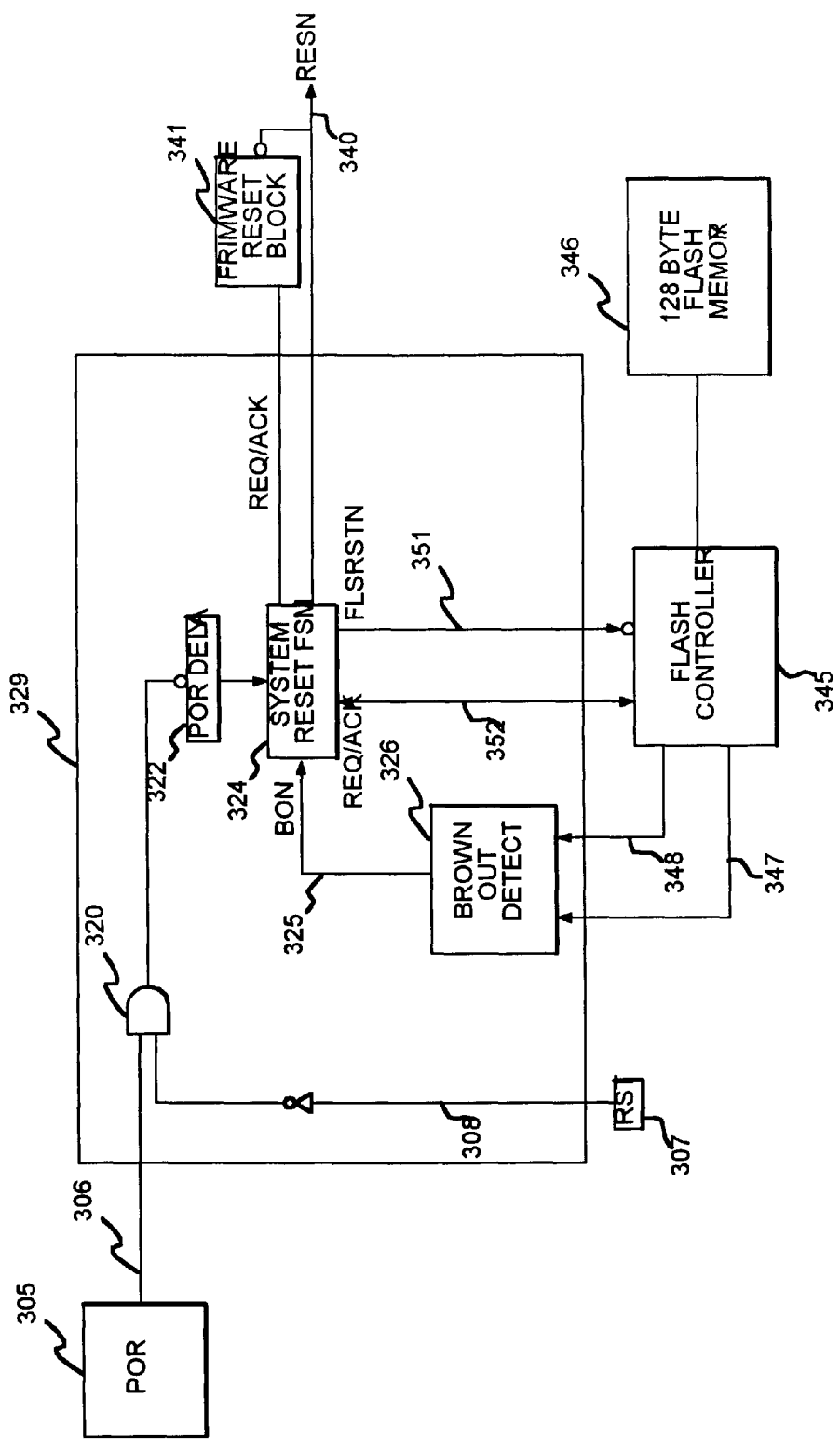
FIG. 3 illustrates a block diagram of an exemplary system reset architecture in accordance with an exemplary embodiment of the present invention.

The POR 128, system reset 192, flash controller 146, flash memory 12A, and associated circuits are described in further detail with reference to FIG. 3. In accordance with one exemplary embodiment, a power-on-reset apparatus comprises a POR device 305 which is a timed delay device configured to delay the release of circuits and is configured to communicate with a system reset device 329. System reset 329 is another exemplary delay device which is further configured to control other devices, receive variable input, and release circuits. System reset 329 is configured to communicate with RST source 307, flash controller 345, and other circuits and devices. Flash controller 345 is a memory controller device configured to communicate with flash memory 346 and system reset 129. A POR device 305 and a RST signal source 307 are connected to a logic device 320. Logic device 320 is, for example, an AND gate, although other logic devices may be used as appropriate. Logic device 320 communicates with, for example, POR delay element 322 which communicates with system reset Finite State Machine ("FSM") 324. System reset FSM 324 is configured in communication with: firmware reset block 341, resn output 340, flash controller 345, and brown out detect device 326. However, although flash controller 345 is shown outside of system reset 329, and brown out detect 326 and logic device 320 are shown inside system reset 329, flash controller 345 may be located inside of system reset 329 and brown out detect 326 and logic device 320 may be located outside of system reset 329 while still implementing the reconfigurable power-on-reset method. Flash controller 345 provides a brown out enable signal via BoEn line 347 and a brown out level signal via BoLvl line 348.

In addition, flash controller 345 is configured in communication with flash memory 346. Flash memory 346, in one exemplary embodiment of the present invention, comprises 128 bytes of memory. Flash controller 345 also is configured in communication with brown out detect 326 via brown out detect output line 325. Flash controller 345 receives a request/acknowledgment signal over req/ack line 352 from system reset FSM 324. In other embodiments, req/ack line 352 may comprise one line for the request signal and a separate line for the acknowledgment signal. Flash controller 345 also receives Flsrstn, an enable signal, for example, from System reset FSM via Flsrstn line 351.

That being said, in an exemplary embodiment of the present invention, with additional reference again to FIG. 2, the step 212 of turning on the IC power supply is implemented by pressing a "power button" on, for example, a personal computer. This initiates the POR timed delay of step 222 which is implemented using a POR device 305. POR device 305 comprises, in one exemplary embodiment of the present invention, circuitry for implementing the timed delay of step 222. During the timed delay period, POR 305 provides a disable signal via POR signal line 306. After completion of the timed delay period, the enable signal of step 224 is provided by POR 305 via POR signal line 306. Furthermore, the RST timed delay step 226 is implemented by an external RST signal source 307 which is configured to provide an RST non-enable signal via RST signal line 308 during the delay period. An RST enable signal is provided by RST signal source 307 there after, implementing step 228. In various aspects of the present invention, other enable signals sources may also be used to delay the release of a portion of the circuits. Furthermore, in other embodiments of the invention, only one of POR 305 and RST 307 are used to trigger release of a portion of the circuits. POR and RST signals are received at logic device 320, which sends a disable signal to hold all circuits in a "reset mode" until all enable signals have been received. In other exemplary embodiments, these enabling signals may be received at a logic device external to the system reset device, or the enabling signals may be individually provided to the system reset device. When all enable signals have been received, an enable signal is sent, in accordance with step 216, from logic device 320 to POR delay device 322.

POR delay device 322 is configured to cause the additional delay of step 229 by waiting an additional period of time, for example 50 milliseconds to 200 milliseconds, before delivering an enable signal to system reset FSM 324. The receipt of enable signals at flash controller 345, in step 260, is implemented when system reset FSM 324 sends "Flsrstn" 351 to flash controller 345 releasing the flash controller circuits. System reset FSM 324 is configured such that upon receipt of an enable signal from POR delay device 322 the system reset FSM 324 sends Flsrstn and a request signal to flash controller 345. The Flsrstn signal on Flsrstn line 351 releases the circuits associated with the flash controller (steps 260). In accordance with step 261, the request signal on req/ack line 352 causes flash controller 345 to read a BOV enable value stored in flash memory 346 in accordance with step 253.

If the enable value is not set indicating that the current voltage level should be compared with a programmed BOV level, then all circuits are released, step 258, when flash controller 345 sends an acknowledgment signal back to system reset FSM 324 which in turn sends a release signal resn 340 which releases all circuits. However, if the BOV enable value is set indicating that the current voltage level should be compared with a programmed BOV level, flash controller 345 retrieves the stored BOV level from flash memory 346 in a step 254. However, flash controller 345 may retrieve both the BOV enable signal and the BOV level during step 253.

The step 256 of comparing the BOV level to the current voltage level is implemented, in an exemplary embodiment via a brown out detect device 326 which receives signals on lines BoEn 347 and BoLvl 348 from flash controller 345. Brown out detect device 326 is configured to compare the current voltage level and the brown out voltage level (BoLvl) received on BoLvl 348 and to provide an enable signal to system reset FSM 324 when the current voltage level is greater than the BoLvl (step 256). The enable signal from brown out detect device 326 to system reset FSM is provided via "bon" signal line 325. FSM 324 may also be configured to implement a further timed delay as shown in step 266 upon receipt of "bon" signal 325.

Therefore, in accordance with various aspects of the present invention, the above method allows reprogramming of the power-on-reset system reset hold times. Thus, in accordance with one aspect of the present invention, a flexibly adaptable power-on-reset device is provided where it is possible to reconfigure the power-on-reset process when a power supply is replaced with a new power supply, or when other modifications are made to the IC device. Furthermore, if, for example, a particular power supply has a quick ramp-up, or if an external power supply monitor is used, the checking process can be disabled entirely. Otherwise the power-on-reset device is programmed to enable the voltage level checking for enhanced reliability. In addition, the ability to reprogram the power-on-reset process enhances the useful life of the integrated circuit by allowing the integrated circuit to be reconfigured and thus modified to meet changing needs.

In further aspects of the present invention, an improved reliability power-on-reset device is provided. The reliability is improved by not using relatively less reliable fuses in this process, but rather using flash memory devices. Fuses may be partially "blown" and it is difficult to test against failure of a fuse. In contrast, use of the more reliable memory devices allows the memory to be reprogrammable as well as more reliable. In addition, device reliability is improved because of the ability to flexibly reconfigure the brown-out voltage level as needed and increasing the probability that all the circuits are turned on only when sufficient voltage levels have been reached.

Furthermore, in accordance with another aspect of the present invention, the accuracy of the IC device is improved by decreasing the "round off error" that results from using discrete devices (i.e., fuses) to set the brown out voltage level. In accordance with another aspect of the present invention, it is possible to reprogram the time and sequence of the power-on-reset steps such that reset time can be adapted to the particular circumstances.

In another aspect of the present invention, additional functionality is provided in the power-on-reset device. For example, security measures may be added which start before most of the circuits on the integrated circuit. Other reprogrammable processes may also be implemented in power-on-reset method and device, thus increasing the functionality of the power-on-reset device. Moreover, in accordance with other aspects of the present invention, these power-on-reset improvements may be obtained using relatively less space and material than that required using fuses.

The present invention has been described above with reference to an exemplary embodiment. However, those skilled in the art will recognize that changes and modifications may be made to the exemplary embodiment without departing from the scope of the present invention. For example, the various components may be implemented in alternate ways, such as varying or alternating the steps in different orders. These alternatives can be suitably selected depending upon the particular application or in consideration of any number of factors associated with the operation of the system. In addition, the techniques described herein may be extended or modified for use with other types of devices, in addition to the microprocessor or to any other master or slave devices. For example, alternative applications may use another reprogrammable device instead of flash memory. These and other changes or modifications are intended to be included within the scope of the present invention.

What is claimed is:

1. A reconfigurable power-on-reset method for use on integrated circuit devices, the method comprising the steps of:
storing power-on-reset data to a flash memory device;
retrieving the power-on-reset data from the flash memory device during a power-on-reset time period;
executing instructional routines, during the power-on-reset time period, according to the power-on-reset data retrieved;
turning on a power supply on an integrated circuit device to start the power-on-reset time period;
holding a plurality of circuits in a reset mode for a first period of time within the power-on-reset time period;
releasing a subset of the plurality of circuits after the first period of time; and
releasing a remainder of the plurality of circuits after a second period of time following the first period of time and within the power-an-reset time period.

2. The reconfigurable power-on-reset method of claim 1 wherein the power-on-reset data comprises a brown out voltage level.

3. The reconfigurabte power-on-reset method of claim 2 wherein the power-on-reset data comprises a brown out enable.

4. The reconfigurable power-on-reset method of claim 1 wherein the executing step occurs during the second period of time and involves the subset of circuits.

5. The reconfigurable power-on-reset method of claim 1 wherein the retrieving step occurs during the second period of time and is executed using the subset of circuits.

6. The reconfigurable power-on-reset method of claim 1, wherein the releasing a subset step further comprises releasing a system reset Finite State Machine device.

7. The reconfigurable power-on-reset method of claim 1, wherein the releasing a subset step further comprises releasing a flash controller.

8. The reconfigurable power-on-reset method of claim 1, wherein the retrieving step further comprises retrieving the data with a flash controller.

9. The reconfigurable power-on-reset method of claim 2, wherein the executing step further comprises the step of providing the brown out voltage level to a brown out detect device and performing a brown out voltage verification before releasing the remainder of the plurality of circuits.

10. The reconfigurable power-on-reset method of claim 3, wherein the executing step further comprises the steps of
performing a brown out voltage verification upon receipt of the brown out enable before releasing the remainder of the plurality of circuits.

11. The reconfigurable power-on-reset method of claim 10, the executing step further comprising the steps of:
verifying the brown out voltage level by comparing the brown out voltage level data with a current voltage reading;
repeating the verification step if the brown out voltage level is greater than the current voltage reading; and
releasing the remainder of the plurality of circuits if the brown out voltage level
is less than the current voltage reading.

12. A power-on-reset device for integrated circuit devices, the power or reset device comprising:
a flash memory configured to hold reconfigurable power-on-reset data;
a flash controller configured to communicate with the flash memory and to direct portions of a power-on-reset process based on the power-on-reset data received from the flash memory during the power-on-reset process; and
a system reset finite state machine configured to hold a plurality of circuits in a reset mode, to enable the flash controller, and to direct portions of the power-on-reset process based on the power-on-reset data received from the flash memory during the power-on-reset process.

13. The power-on-reset device of claim 12 further comprising a brown out detect device configured to compare a current voltage level of the integrated circuit device with a brown out voltage level and to generate a brown out enable signal when the current voltage level is greater than the brown out voltage level, wherein the brown out voltage level is included in the power-on-reset data.

14. The power-on-reset device of claim 13 wherein the system reset finite state machine is further configured to release all circuits upon receipt of the brown out enable signal.

15. A power-on-reset device for an integrated circuit device, the power or reset device comprising:

a flash memory configured to hold reconfigurable power-on-reset data;

a flash controller configured to retrieve the reconfigurable power-on-reset data from the flash memory;

a brown out detect device configured to receive the reconfigurable power-on-reset data from the flash controller and to compare a current voltage level of an integrated circuit power supply with a brown out voltage level from a subset of the reconfigurable power-on-reset data retrieved from flash memory; and a system reset finite state machine configured to hold a plurality of circuits in a reset mode, to enable the flash controller, to communicate with the brown out detect device, and to release a remainder of the plurality of circuits when the current voltage level is greater than the brown out voltage level.

16. The power-on-reset device of claim 15 wherein the brown out detect device is configured to generate a bon signal when the current voltage level is greater than the brown out voltage level.

17. The power-on-reset device of claim 16 wherein the system reset finite state machine is further configured to release the remainder of the plurality of circuits upon receipt of the bon signal.

18. The power-on-reset device of claim 17 wherein the reconfigurable power-on-reset data comprises a brown out enable signal and wherein the flash controller and brown out detect device are configured to compare the current voltage level to the brown out voltage level when the brown out enable signal is enabled.

19. An integrated circuit configured with a power-on-reset device, the integrated circuit comprising:

a flash memory within a microprocessor, wherein the flash memory is configured to reprogrammably store power-on-reset data: and a flash controller within the microprocessor wherein the microprocessor is configured to release the flash controller during a power-on-reset time period and wherein the flash controller is configured to retrieve power-on-reset data from the flash memory during the power-on-reset time period: and a system reset device configured to hold a plurality of circuits in a reset mode for a first period of time, to release a subset of the plurality of circuits after the first period of time, and to release all circuits after a second period of time.

20. The integrated circuit of claim 19 wherein the system reset device further comprises:

a brown out detect device configured to receive the power-on-reset data from the flash controller and to compare a current voltage level of the integrated circuit power supply with a brown out voltage level from a subset of the power-on-reset data; and a system reset finite state machine configured to hold the plurality of circuits in a reset mode, to enable the flash controller, to communicate with the brown out detect device, and to release a remainder of the plurality of circuits when the current voltage level is greater than the brown out voltage level.

21. The integrated circuit of claim 19 further comprising:

a power-on-reset device configured to communicate with the system reset device, and configured to release the system reset device after the first period of time.

22. The integrated circuit of claim 20 further comprising:

a power-on-reset delay device configured to provide additional delay before the system reset finite state machine can release any circuits.

* * * * *